US011638373B2

(12) United States Patent
Liu et al.

(10) Patent No.: US 11,638,373 B2
(45) Date of Patent: Apr. 25, 2023

(54) MATERIAL VERIFICATION METHOD AND COMPUTING DEVICE UTILIZING METHOD

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Eddy Liu, New Taipei (TW); Zhuan-Feng Li, Zhengzhou (CN); Hong-Li Tian, Zhengzhou (CN); Yan-Bing Feng, Zhengzhou (CN); Guan-Hong Tang, Zhengzhou (CN); Ya-Hui Xu, Zhengzhou (CN); Hsin-Ta Lin, New Taipei (TW); Xiao-Juan Zhang, Zhengzhou (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 342 days.

(21) Appl. No.: 17/025,392

(22) Filed: Sep. 18, 2020

(65) Prior Publication Data

US 2021/0360842 A1 Nov. 18, 2021

(30) Foreign Application Priority Data

May 12, 2020 (CN) .............................. 202010399382

(51) Int. Cl.
*H05K 13/08* (2006.01)
*G08B 21/18* (2006.01)
*G05B 19/406* (2006.01)

(52) U.S. Cl.
CPC ......... *H05K 13/086* (2018.08); *G05B 19/406* (2013.01); *G08B 21/182* (2013.01); *H05K 13/0813* (2018.08); *G05B 2219/32268* (2013.01)

(58) Field of Classification Search
CPC . Y02P 90/02; H05K 3/00; H05K 7/00; H05K 13/0818; H05K 13/084; H05K 13/087; H05K 13/0813; H05K 13/086; G05B 19/406; G05B 2219/32268
See application file for complete search history.

(56) References Cited

U.S. PATENT DOCUMENTS

2020/0128710 A1* 4/2020 Iisaka ................ H05K 13/0419

FOREIGN PATENT DOCUMENTS

WO WO-2021205612 A1 * 10/2021

\* cited by examiner

*Primary Examiner* — Vincent H Tran
(74) *Attorney, Agent, or Firm* — ScienBiziP, P.C.

(57) ABSTRACT

In a material verification method, information of newly loaded materials in a production line is obtained. It is determined whether the information has been verified. If the information has not been verified, it is determined whether a tray supporting the newly loaded materials has been switched from use in producing a first product to use in producing a second product. If the tray supporting the newly loaded materials is not switched to use in producing the second product, the information of the newly loaded materials is presented to a user for material verification. A system for administering such method and a device applying the method are also disclosed.

20 Claims, 3 Drawing Sheets

MATERIAL VERIFICATION METHOD AND COMPUTING DEVICE UTILIZING METHOD

FIELD

The subject matter herein generally relates to manufacturing of electronic products, specifically a material verification method, a material verification system, a computing device, and a computer storage medium.

BACKGROUND

In many production lines, more than 95% of materials (electronic components) are surface mounted technology (SMT) components and are mounted on printed circuit boards (PCBs) of electronic products through SMT machines. The SMT components are loaded into the production lines manually by workers, which may lead to errors. To prevent such errors in loaded materials, after the workers load the materials, it must be verified by a material verifier and a re-checking inspector may need to perform a second verification to confirm the materials.

However, material verifiers and re-checking inspectors cannot obtain information as to loaded materials in time and accurately, nor can they perform material verification in a timely and efficient manner.

DETAILED DESCRIPTION

For clarity, of illustration of objectives, features and advantages of the present disclosure, the drawings combined with the detailed description illustrate the embodiments of the present disclosure hereinafter. It is noted that embodiments of the present disclosure and features of the embodiments can be combined, when there is no conflict.

Various details are described in the following descriptions for better understanding of the present disclosure, however, the present disclosure may also be implemented in other ways other than those described herein. The scope of the present disclosure is not to be limited by the specific embodiments disclosed below.

Unless defined otherwise, all technical and scientific terms used herein have the same meaning as commonly understood by one of ordinary skill in the art to which the present disclosure belongs. The terms used herein in the present disclosure are only for the purpose of describing specific embodiments, and are not intended to limit the present disclosure.

The material verification method may be executed by one or more computing devices. The computing device may be a device that can automatically perform numerical calculation and/or information processing according to preset or stored instructions, and hardware of the computing device may include, but is not limited to, a microprocessor, an Application Specific Integrated Circuit (ASIC), a Field-Programmable Gate Array (FPGA), a Digital Signal Processor (DSP), an embedded device, etc.

The computing device may be a desktop computer, a notebook, a palmtop computer and a cloud server. The computing device can interact with a user through a keyboard, a mouse, a remote control, a touchpad, or a voice control device.

Embodiment of Method

Figure 1:
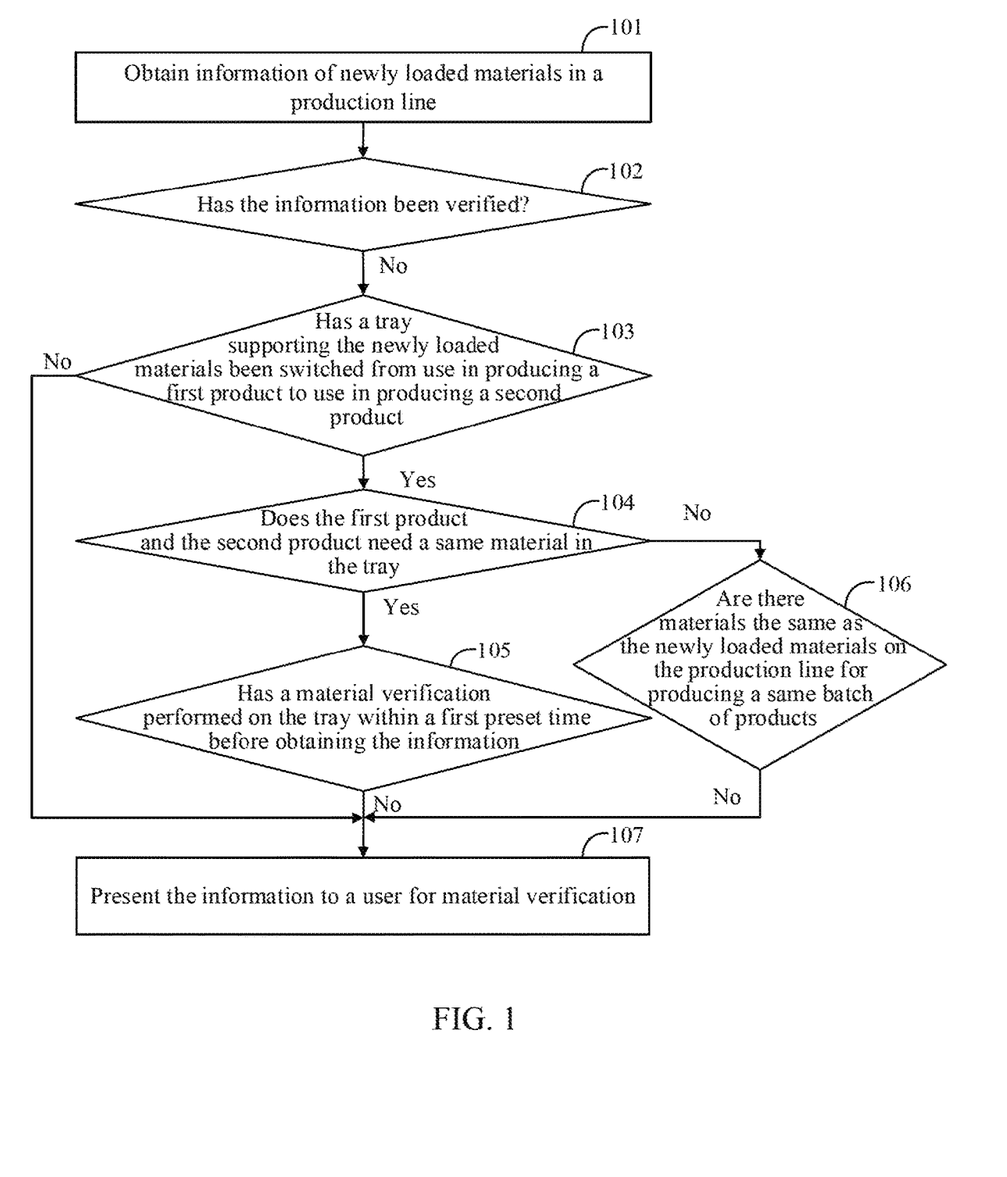
FIG. 1 is a flowchart of a material verification method in one embodiment.

FIG. 1 is a flowchart of a material verification method in one embodiment. The method presents information to a user in time regarding material which is loaded for verification of the material. According to different requirements, the order of the steps in the flowchart may be changed, and some steps may be omitted.

In block 101, the computing device obtains information of newly loaded materials in a production line.

The newly loaded materials are newly loaded into the production line for making products by a machine.

In one embodiment, the information may include a line number, a machine number, a track number, a tray number, a material number, a loading time, and a machine area of the newly loaded materials.

The line number indicates the production line.

The machine number represents the machine that is to use the newly loaded materials to produce products. In one embodiment, the machine is a Surface Mounted Technology (SMT) machine.

The track number indicates a track where the newly loaded materials are located.

The tray number indicates a tray supporting the newly loaded materials. The tray may be placed in a track for storing the newly loaded materials.

The material number indicates a type or kind of the newly loaded materials.

The machine area indicates a region where the machine is located. The machine area may include an odd-numbered area and an even-numbered area. The odd-numbered area and the even-numbered area are on either side of a production line.

In one embodiment, obtaining the information of the newly loaded materials may include obtaining the information from a production information database.

The production information database may be a Shop Floor Control (SFC) database. The computing device can be connected to an SFC system, and the SFC system can be connected to a data collection device. The data collection device collects information from a production site and uploads the information to the SFC system. The computing device obtains the information from the SFC database of the SFC system.

In block 102, the computing device determines whether the information of the newly loaded materials has been verified.

In one embodiment, the computing device may include an application database that stores information as to material that has been verified. A method of determining whether the information of the newly loaded materials has been verified may include determining whether the information of the newly loaded materials is included in the application database. If the information of the newly loaded materials is included in the application database, the information has been verified. If the information of the newly loaded materials is not included in the application database, the information has not been verified.

In other embodiments, information as to material may include a mark as to checkability (check mark) information. If the information has been verified, the check mark may be set as "1". If the information has not been verified, the check mark may be set as "0".

If the information of the newly loaded materials has been verified, the process may end, the information of the newly loaded materials is not presented to user.

In block 103, if the information of the newly loaded materials has not been verified, the computing device determines whether a tray supporting the newly loaded materials has been switched from use in producing a first product to use in producing a second product.

Each production line has a certain production plan, and each tray on the production line may be used to produce different products. The first product and the second product may be different types of products (for example, the first product is mobile phone and the second product is tablet), different models of products, or different batches of products.

The computing device may be connected to a production management system. The computing device may obtain product information of a production line from the production management system, and determine whether the tray supporting the newly loaded materials has been switched from use in producing the first product to use in producing the second product according to the product information.

In block 104, if the tray supporting the newly loaded materials has been switched from use in producing the first product to use in producing the second product, the computing device determines whether the first product and the second product need a same material in the tray.

Determining whether the first product and the second product need a same material in the tray can be done according to a first material number before a switching of the tray and a second material number after the switching of the tray. If the first material number and the second material number are the same, the first product and the second product need a same material in the tray. If the first material number and the second material number are different, the first product and the second product need different materials in the tray.

In block 105, if the first product and the second product need a same material in the tray, the computing device determines whether a material verification has been performed on the tray within a first preset time before obtaining the information of the newly loaded materials.

For example, if the first product and the second product need a same material in the tray, a determination is made as to whether a material verification has been performed on the tray within the last 24 hours before obtaining the information of the newly loaded materials.

If a material verification has been performed on the tray within a first preset time before obtaining the information of the newly loaded materials, the process may end, and the information of the newly loaded materials is not presented to the user.

In block 106, if the first product and the second product need different materials in the tray, the computing device determines whether there are materials the same as the newly loaded materials on the production line for producing a same batch of products.

If such same materials do exist on the production line for producing a same batch of products, the newly loaded materials may be regarded as normal materials, the process may end, and the information of the newly loaded materials is not presented to the user.

In block 107, if the tray supporting the newly loaded materials is not switched from use in producing the first product to use in producing the second product, or if no material verification has been performed on the tray within the first preset time before obtaining the information of the newly loaded materials, or if there are no materials the same as the newly loaded materials on the production line for producing a same batch of products, the computing device presents the information of the newly loaded materials to the user for material verification.

If the tray supporting the newly loaded materials is not switched from use in producing the first product to use in producing the second product, the information of the newly loaded materials is presented to the user for material verification.

If no material verification has been performed on the tray within the first preset time before obtaining the information of the newly loaded materials, the information of the newly loaded materials is presented to the user for material verification. For example, if no material verification has been performed on the tray within 24 hours before obtaining the information of the newly loaded materials, the information of the newly loaded materials may be presented to the user for material verification.

If there are no materials the same as the newly loaded materials on the production line for producing a same batch of products, this is taken as an indication that the newly loaded materials may be wrong materials, and the information of the newly loaded materials may be presented to the user for material verification.

The information of the newly loaded materials may be presented to the user through SMS messages, WECHAT, emails, application messages, etc.

The user may be a material verifier and/or re-checking inspector. By receiving the information, the user can promptly be informed of the newly added materials on the production line, and can quickly locate the newly loaded materials according to the information.

In one embodiment, an application program for material verification can be installed on a terminal (such as a mobile phone). The computing device may present the information to the user through the application program. The user can view the information on a user interface of the application program.

The application program can display the information according to the machine area. For example, the application program may display the information in a first page or section if the machine area corresponds to an odd-numbered area, and display the information in a second page or section if the machine area corresponds to an even-numbered area.

The material verification method obtains information of newly loaded materials in a production line. A determination is made as to whether the information of newly loaded materials has been verified. If the information of the newly loaded materials has not been verified, a determination is made as to whether a tray supporting the newly loaded materials has been switched from use in producing a first product to use in producing a second product. If the tray supporting the newly loaded materials has been switched from use in producing the first product to use in producing the second product, a determination is made as to whether the first product and the second product require a same material in the tray. If a same material is required by the first product and the second product, a determination is made as to whether a material verification has been performed on the tray within a first preset time before obtaining the information of the newly loaded materials. If the first product and the second product need different materials in the tray, a determination is made as to whether there are materials the same as the newly loaded materials on the production line for producing a same batch of products. If the tray supporting the newly loaded materials is not switched from use in producing the first product to use in producing the second product, or if no material verification has been performed on the tray within the first preset time before obtaining the information of the newly loaded materials, or if there are no materials the same as the newly loaded materials on the production line for producing a same batch of products, the information of the newly loaded materials is presented to the user for material verification.

The material verification method presents the information to be verified to the user in time, so that the user can accurately and quickly determine a position of the newly loaded materials. Efficiency and accuracy of verifying the information are improved, and time of verification is shortened.

In another embodiment, the method may further include determining whether the information presented to the user is verified within a second preset time. If verification is not performed within the second preset time, a first alarm message is issued.

For example, it is determined whether the information presented to the user is verified within 30 minutes. If such verification is not carried out within 30 minutes, the first alarm message is issued.

Issuing the first alarm message may include controlling the machine to emit a first audible alarm and/or a first light alarm, sending first alarm information through the application program, and sending a first alarm in SMS message.

In another embodiment, after the first alarm message is issued, the method may further include controlling the machine to stop working.

In another embodiment, the method may further include: uploading the information to the application database, if the information has been verified.

The application database records all information that has been verified. According to the application database, any material of which information is given can be determined as verified or not verified.

In another embodiment, the method may further include obtaining abnormal information relating abnormal materials in the production line and presenting the abnormal information to the user.

The abnormal information may indicate a wrong material number, a wrong quantity of materials, and the like. The abnormal information can be obtained from the production information database.

In another embodiment, the method may further include determining whether the abnormal information presented to the user is verified within a third preset time. If the abnormal information presented to the user is not verified within the third preset time, a second alarm message is issued.

For example, it is determined whether the abnormal information presented to the user is verified within 3 minutes. If the abnormal information presented to the user is not verified within 3 minutes, the second alarm message is issued.

Issuing the second alarm message may include controlling the machine to emit a second audible alarm and/or a second light alarm, sending second alarm information through the application program, and sending a second alarm in SMS message.

Embodiment of System

Figure 2:
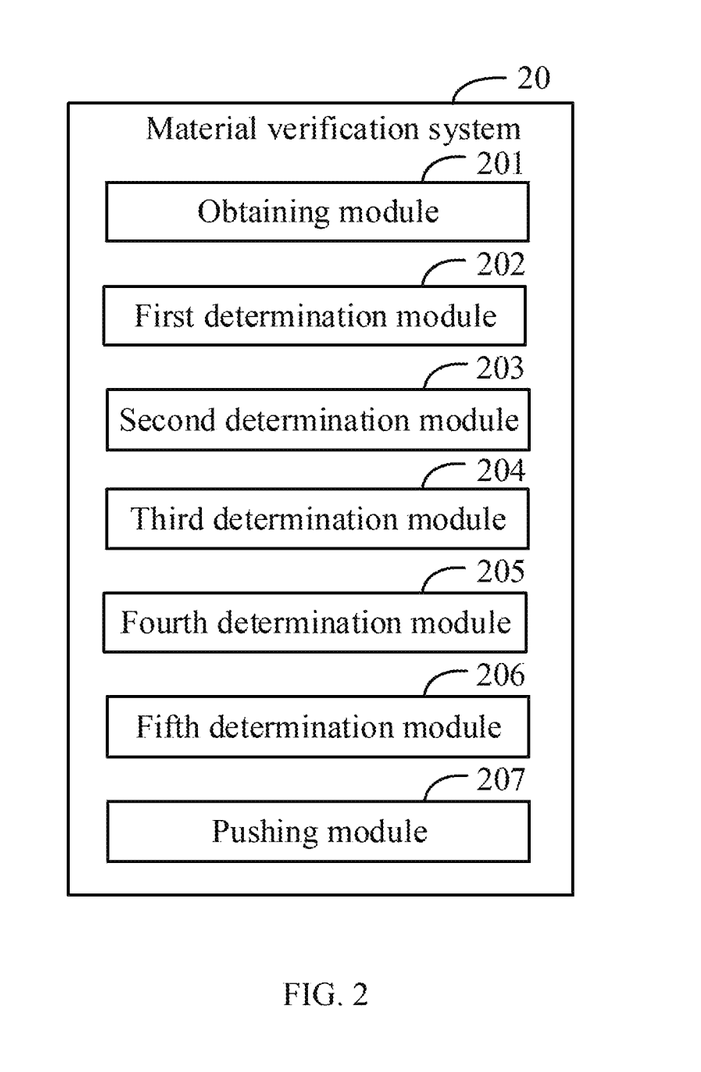
FIG. 2 is a block diagram of a material verification system provided in one embodiment.

FIG. 2 is a block diagram of a material verification system provided in one embodiment of the present disclosure. The material verification system 20 may run in a computing device. The material verification system 20 presents to a user regarding material which is loaded in time for verification of the material.

In one embodiment, the material verification system 20 may be divided into a plurality of functional modules. The functional modules may include: an obtaining module 201, a first determination module 202, a second determination module 203, a third determination module 204, a fourth determination module 205, a fifth determination module 206, and a presenting module 207. A module as referred to in the present disclosure refers to a series of computer-readable instruction segments that can be executed by at least one processor and that are capable of performing fixed functions, which are stored in a storage device.

The obtaining module 201 is configured to obtain information of newly loaded materials in a production line.

The newly loaded materials are newly loaded into the production line for making products by a machine.

In one embodiment, the information may include a line number, a machine number, a track number, a tray number, a material number, a loading time, and a machine area of the newly loaded materials.

The line number indicates the production line.

The machine number represents the machine that is to use the newly loaded materials to produce products. In one embodiment, the machine is a Surface Mounted Technology (SMT) machine.

The track number indicates a track where the newly loaded materials are located.

The tray number indicates a tray supporting the newly loaded materials. The tray may be placed in a track for storing the newly loaded materials.

The material number indicates a type or kind of the newly loaded materials.

The machine area indicates a region where the machine is located. The machine area may include an odd-numbered area and an even-numbered area. The odd-numbered area and the even-numbered area are on either side of a production line.

In one embodiment, obtaining the information of the newly loaded materials may include obtaining the information from a production information database.

The production information database may be a Shop Floor Control (SFC) database. The computing device can be connected to a SFC system, and the SFC system can be connected to a data collection device. The data collection device collects information from a production site and uploads the information to the SFC system. The computing device obtains the information from the SFC database of the SFC system.

The first determination module 202 determines whether the information of the newly loaded materials has been verified.

In one embodiment, the computing device may include an application database that stores information as to material that has been verified. A method of determining whether the information of the newly loaded materials has been verified may include: determining whether the information of the newly loaded materials is included in the application database. If the information of the newly loaded materials is included in the application database, the information has been verified. If the information of the newly loaded materials is not included in the application database, the information has not been verified.

In other embodiments, information as to material may include a mark as to checkability (check mark). If the information has been verified, the check mark may be set as "1". If the information has not been verified, the check mark may be set as "0". If the information of the newly loaded materials has been verified, the information of the newly loaded materials is not presented to the user.

The second determination module 203 is configured to determine whether a tray supporting the newly loaded materials has been switched from use in producing a first product to use in producing a second product, if the information of the newly loaded materials has not been verified.

Each production line has a certain production plan, and each tray on the production line may be used to produce different products. The first product and the second product may be different types of products (for example, the first product is mobile phone and the second product is tablet), different models of products, or different batches of products.

The computing device may be connected to a production management system. The computing device may obtain product information of a production line from the production management system, and determine whether the tray supporting the newly loaded materials has been switched from use in producing the first product to use in producing the second product according to the product information.

The third determination module 204 is configured to determine whether the first product and the second product need a same material in the tray, if the tray supporting the newly loaded materials has been switched from use in producing the first product to use in producing the second product.

Determining whether the first product and the second product need a same material in the tray can be done according to a first material number before a switching of the tray and a second material number after the switching of the tray. If the first material number and the second material number are the same, the first product and the second product need a same material in the tray. If the first material number and the second material number are different, the first product and the second product need different materials in the tray.

The fourth determination module 205 is configured to determine whether a material verification has been performed on the tray within a first preset time before obtaining the information of the newly loaded materials, if the first product and the second product need a same material in the tray.

For example, if the first product and the second product need a same material in the tray, a determination is made as to whether a material verification has been performed on the tray within the last 24 hours before obtaining the information of the newly loaded materials.

If a material verification has been performed on the tray within a first preset time before obtaining the information of the newly loaded materials, the process may end, and the information of the newly loaded materials is not presented to the user.

The fifth determination module 206 is configured to determine whether there are materials the same as the newly loaded materials on the production line for producing a same batch of products, if the first product and the second product need different materials in the tray.

If such same materials do exist on the production line for producing a same batch of products, the newly loaded materials may be regarded as normal materials, the process may end, and the information of the newly loaded materials is not presented to the user.

The presenting module 207 is configured to present the information of the newly loaded materials to the user for material verification, if the tray supporting the newly loaded materials is not switched from use in producing the first product to use in producing the second product, or if no material verification has been performed on the tray within the first preset time before obtaining the information of the newly loaded materials, or if there are no materials the same as the newly loaded materials on the production line for producing a same batch of products.

If the tray supporting the newly loaded materials is not switched from use in producing the first product to use in producing the second product, the information of the newly loaded materials may be presented to the user for material verification.

If no material verification has been performed on the tray within the first preset time before obtaining the information of the newly loaded materials, the information of the newly loaded materials may be presented to the user for material verification. For example, if no material verification has been performed on the tray within 24 hours before obtaining the information of the newly loaded materials, the information of the newly loaded materials may be presented to the user for material verification.

If there are no materials the same as the newly loaded materials on the production line for producing a same batch of products, which indicates that the newly loaded materials may be wrong materials, and the information of the newly loaded materials may be presented to the user for material verification.

The information of the newly loaded materials may be presented to the user through short messages, WeChat, emails, application messages, etc.

The user may be a material verifier and/or re-checking inspector. By presenting the information to the user, the user can promptly be informed of the newly loaded materials on the production line, and can quickly locate the newly loaded materials according to the information.

In one embodiment, the user may install an application program for material verification on a terminal (such as a mobile phone). The computing device may present the information to the user through the application program. The user can view the information on a user interface of the application program.

The application program can display the information according to the machine area. For example, the application program may display the information in a first page if the machine area corresponding to an odd-numbered area, and may display the information in a second page if the machine area corresponding to an even-numbered area.

The material verification system 20 obtains information of materials that are newly loaded into a production line for a machine. It is determined whether the information of the newly loaded materials has been verified. If the information of the newly loaded materials has not been verified, it is determined whether a tray supporting the newly loaded materials has been switched from use in producing a first product to use in producing a second product. If the tray supporting the newly loaded materials has been switched from use in producing the first product to use in producing the second product, it is determined whether the first product and the second product need a same material in the tray. If the first product and the second product need a same material in the tray, it is determined whether a material verification has been performed on the tray within a first preset time before obtaining the information of the newly loaded materials. If the first product and the second product need different materials in the tray, it is determined whether there are materials the same as the newly loaded materials on the production line for producing a same batch of products. If the tray supporting the newly loaded materials is not switched from use in producing the first product to use in producing the second product, or if no material verification has been performed on the tray within the first preset time before obtaining the information of the newly loaded materials, or if there are no materials the same as the newly loaded materials on the production line for producing a same batch of products, the information of the newly loaded materials is presented to the user for material verification.

The material verification system 20 presents the information to be verified to the user in time, so that the user can accurately and quickly determine a position of the newly loaded materials. A time for verifying the information is shorten, and verification efficiency is improved.

In another embodiment, the system 20 may further include a first alarm module configured to determine whether the information presented to the user is verified within a second preset time; if the information presented to the user is not verified within the second preset time, issuing the first alarm message.

For example, it is determined whether the information presented to the user is verified within 30 minutes. If the information presented to the user is not verified within 30 minutes, the first alarm message is issued.

Issuing the first alarm message may include: controlling the machine to emit a first audible alarm and/or a first light alarm, sending first alarm information through the application program, and sending a first alarm in SMS message.

In another embodiment, the system 20 may further include a control module configured to control the machine to stop working after the first alarm message is issued.

In another embodiment, the system 20 may further include an updating module configured to upload the information to the application database, if the information has been verified.

The application database records all information that has been verified. According to the application database, any material of which information is given can be determined as verified or not verified.

In another embodiment, the system 20 may further include an abnormal information presenting module configured to obtain abnormal information relating abnormal materials in the production line, and present the abnormal information to the user.

The abnormal information may indicate a wrong material number, a wrong quantity of materials, and the like. The abnormal information can be obtained from the production information database.

In another embodiment, the system 20 may further include a second alarm module configured to determine whether the abnormal information presented to the use is verified within a third preset time, and issue a second alarm message if the abnormal information presented to the use is not verified within the third preset time.

For example, it is determined whether the abnormal information presented to the user is verified within 3 minutes. If the abnormal information presented to the user is not verified within 3 minutes, the second alarm message is issued.

Issuing the second alarm message may include controlling the machine to emit a second audible alarm and/or a second light alarm, sending second alarm information through the application program, and sending a second alarm in SMS message.

Embodiment of Storage Medium

The embodiment provides a storage medium on which a computer program is stored. When the computer program is executed by a processor, the blocks in the embodiment of the material verification method may be implemented, such as 101 to 107 in FIG. 1. Alternatively, when the computer program is executed by the processor, the functions of the material verification system may be implemented, such as the modules 201 to 207 in FIG. 2.

Embodiment of Computing Device

Figure 3:
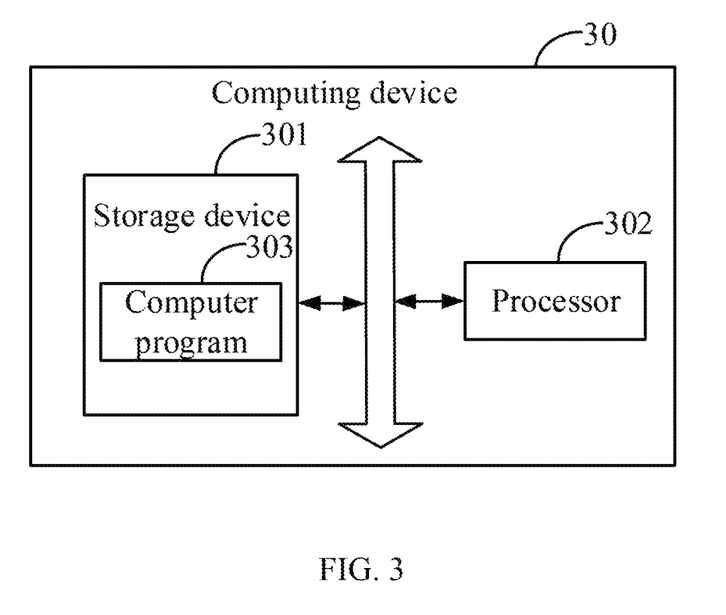
FIG. 3 is a block diagram of a computing device in one embodiment of the present disclosure.

FIG. 3 is one embodiment of a block diagram of a computing device of the present disclosure. The computing device 30 may include a storage device 301, a processor 302, and a computer program 303, such as a material verification program stored in the storage device 301 and executable by the processor 302. The processor 302 may execute the computer program 303 to implement the blocks in the material verification method described above, such as the blocks 101 to 107 in FIG. 1. Alternatively, the processor 302 may execute the computer program 303 to implement the functions of the material verification system described above, such as the modules 201 to 207 in FIG. 2.

In an exemplary embodiment, the computer program 303 may be divided into one or more modules, and the one or more modules are stored in the storage device 301 and executed by the processor 302 to complete the material verification method of the present disclosure. The one or more modules can be a series of computer-readable instruction segments capable of performing specific functions, and the instruction segments are used to describe execution processes of the computer program 303 in the computing device 30.

The computing device 30 may be a desktop computer, a notebook, a palmtop computer, or a cloud server. Those skilled in the art will understand that the block diagram is only an example of the computing device 30, and does not constitute a limitation on the computing device 30. Other examples of the computing device 30 may include more or fewer components than shown in FIG. 3, or combine some components or have different components. For example, the computing device 30 may further include an input/output device, a network access device, a bus, and the like.

The processor 302 may be a central processing unit (CPU) or other general-purpose processor, a digital signal processor (DSP), an application specific integrated circuit (ASIC), a Field-Programmable Gate Array (FPGA) or other programmable logic device, a discrete gate, or a transistor logic device, or a discrete hardware component, etc. The processor 302 may be a microprocessor or any conventional processor. The processor 302 may be a control center of the computing device 30, and connect various parts of the entire computing device 30 by using various interfaces and lines.

The storage device 301 may be configured to store the computer program 303 and/or modules. The processor 302 may run or execute the computer-readable instructions and/or modules stored in the storage device 301, and may invoke data stored in the storage device 301 to implement various functions of the computing device 30. The storage device 301 may include a program storage area and a data storage area. The program storage area may store an operating system, an application program required for at least one function (such as a sound playback function, an image playback function), etc. The data storage area may store data created for using the computing device 30. In addition, the storage device 301 may include a random access memory, and may also include a non-transitory storage medium, such as a hard disk, an internal memory, a plug-in hard disk, a smart media card (SMC), and a secure digital (SD) card, a flash card, at least one disk storage device, a flash memory, or other non-transitory solid-state storage device.

When the modules integrated in the computing device 30 are implemented in the form of software functional units and used as independent units, they can be stored in a non-transitory readable storage medium. Based on this understanding, all or part of the processes in the methods of the above embodiments implemented by the present disclosure can also be completed by related hardware instructed by computer-readable instructions. The computer-readable instructions may be stored in a non-transitory readable storage medium. The computer-readable instructions, when executed by the processor, may implement the steps of the foregoing method embodiments. The computer-readable instructions include computer-readable instruction codes, and the computer-readable instruction codes can be source code, object code, an executable file, or in some intermediate form. The non-transitory readable storage medium may include any entity or device capable of carrying the computer-readable instruction code, a recording medium, a U disk, a mobile hard disk, a magnetic disk, an optical disk, a computer memory, and a read-only memory (ROM).

In several embodiments provided in the preset application, it should be understood that the disclosed computing device and method may be implemented in other ways. For example, the embodiment of the computing device described above is merely illustrative. For example, the units are only obtained by logical function divisions, and there may be other manners of division in actual implementation.

The modules described as separate components may or may not be physically separated, and the components displayed as modules may or may not be physical modules, that is, may be located in one place, or may be distributed on multiple network elements. Some or all of the modules may be selected according to actual needs to achieve the purpose of the solution of this embodiment.

In addition, each functional unit in each embodiment of the present disclosure can be integrated into one processing unit, or can be physically present separately in each unit, or two or more units can be integrated into one unit. The above integrated unit can be implemented in a form of hardware or in a form of a software functional unit.

The above integrated modules implemented in the form of function modules may be stored in a storage medium. The above function modules may be stored in a storage medium, and include several instructions to enable a computing device (which may be a personal computer, server, or network device, etc.) or processor to execute the method described in the embodiment of the present disclosure.

The present disclosure is not limited to the details of the above-described exemplary embodiments, and the present disclosure can be embodied in other specific forms without departing from the spirit or essential characteristics of the present disclosure. Therefore, the present embodiments are to be considered as illustrative and not restrictive, and the scope of the present disclosure is defined by the appended claims. All changes and variations in the meaning and scope of equivalent elements are included in the present disclosure. Any reference sign in the claims should not be construed as limiting the claim. Furthermore, the word "comprising" does not exclude other units nor does the singular exclude the plural. A plurality of units or devices stated in the system claims may also be implemented by one unit or device through software or hardware. Words such as "first" and "second" are used to indicate names but do not signify any particular order.

Finally, the above embodiments are only used to illustrate technical solutions of the present disclosure, and are not to be taken as restrictions on the technical solutions. Although the present disclosure has been described in detail with reference to the above embodiments, those skilled in the art should understand that the technical solutions described in one embodiments can be modified, or some of technical features can be equivalently substituted, and that these modifications or substitutions are not to detract from the essence of the technical solutions or from the scope of the technical solutions of the embodiments of the present disclosure.

We claim:

1. A material verification method, comprising:
obtaining information of newly loaded materials in a production line;
determining whether the information of the newly loaded materials has been verified;
determining whether a tray supporting the newly loaded materials has been switched from use in producing a first product to use in producing a second product, upon a condition that the information of the newly loaded materials has not been verified;
presenting the information of the newly loaded materials to a user for material verification, upon a condition that the tray supporting the newly loaded materials is not switched from use in producing the first product to use in producing the second product;
determining whether the first product and the second product need a same material in the tray, upon a condition that the tray supporting the newly loaded materials has been switched from use in producing the first product to use in producing the second product;
determining whether a material verification has been performed on the tray within a first preset time before obtaining the information of the newly loaded materials, upon a condition that the first product and the second product need a same material in the tray;
presenting the information of the newly loaded materials to the user for material verification, upon a condition that no material verification has been performed on the tray within the first preset time before obtaining the information of the newly loaded materials;
determining whether the information presented to the user is verified within a second preset time;
issuing a first alarm message, upon a condition that the information presented to the user is not verified within the second preset time; and
controlling a machine that is to use the newly loaded materials to produce products to stop working after the first alarm message is issued.

2. The material verification method of claim 1, wherein the information of the newly loaded materials comprises a mark, if the information has been verified, the check mark is set as "1", and if the information has not been verified, the check mark is set as "0".

3. The material verification method of claim 1, further comprising:
determining whether there are materials the same as the newly loaded materials on the production line for producing a same batch of products, upon a condition that the first product and the second product need different materials in the tray; and
presenting the information of the newly loaded materials to the user for material verification, upon a condition that there are no materials the same as the newly loaded materials on the production line for producing the same batch of products.

4. The material verification method of claim 1, wherein obtaining the information of the newly loaded materials comprises:
obtaining the information from a production information database.

5. The material verification method of claim 1, further comprising:
presenting the information to the user through an application program installed on a terminal, wherein the application program displays the information according to a machine area of the newly loaded material, wherein the application program displays the information in a first page or section if the machine area corresponds to an odd-numbered area, and displays the information in a second page or section if the machine area corresponds to an even-numbered area.

6. The material verification method of claim 1, further comprising:
uploading the information to an application database, upon a condition that the information has been verified.

7. The material verification method of claim 1, further comprising:
obtaining abnormal information relating abnormal materials in the production line; and
presenting the abnormal information to the user.

8. The material verification method of claim 7, further comprising:
determining whether the abnormal information presented to the user is verified within a third preset time; and
issuing a second alarm message, upon a condition that the abnormal information presented to the user is not verified within the third preset time.

9. The material verification method of claim 1, wherein the information comprises a line number, a machine number, a track number, a tray number, a material number, a loading time, and a machine area of the newly loaded material.

10. A computing device comprising a processor and a storage device, and the processor executing computer-readable instructions stored in the storage device to implement the following method:
obtaining information of materials that are newly loaded into a production line for a machine;
determining whether the information of the newly loaded materials has been verified;
determining whether a tray supporting the newly loaded materials has been switched from use in producing a first product to use in producing a second product, upon a condition that the information of the newly loaded materials has not been verified;
presenting the information of the newly loaded materials to a user for material verification, upon a condition that the tray supporting the newly loaded materials is not switched from use in producing the first product to use in producing the second product;
determining whether the first product and the second product need a same material in the tray, upon a condition that the tray supporting the newly loaded materials has been switched from use in producing the first product to use in producing the second product;
determining whether a material verification has been performed on the tray within a first preset time before obtaining the information of the newly loaded materials, upon a condition that the first product and the second product need a same material in the tray;
presenting the information of the newly loaded materials to the user for material verification, upon a condition that no material verification has been performed on the tray within the first preset time before obtaining the information of the newly loaded materials;
determining whether the information presented to the user is verified within a second preset time;
issuing a first alarm message, upon a condition that the information presented to the user is not verified within the second preset time; and
controlling a machine that is to use the newly loaded materials to produce products to stop working after the first alarm message is issued.

11. The computing device of claim 10,
wherein the information of the newly loaded materials comprises a mark, if the information has been verified, the check mark is set as "1", and if the information has not been verified, the check mark is set as "0".

12. The computing device of claim 10, wherein the method further comprises:
determining whether there are materials the same as the newly loaded materials on the production line for producing a same batch of products, upon a condition that the first product and the second product need different materials in the tray; and
presenting the information of the newly loaded materials to the user for material verification, upon a condition that there are no materials the same as the newly loaded materials on the production line for producing the same batch of products.

13. The computing device of claim 10, wherein the method further comprises:
obtaining abnormal information relating abnormal materials in the production line; and
presenting the abnormal information to the user.

14. The computing device of claim 13, wherein the method further comprises:
determining whether the abnormal information presented to the user is verified within a third preset time; and
issuing a second alarm message, upon a condition that the abnormal information presented to the user is not verified within the third preset time.

15. A non-transitory storage medium having stored thereon computer-readable instructions that, when the computer-readable instructions are executed by a processor to implement the following method:
obtaining information of materials that are newly loaded into a production line for a machine;
determining whether the information of the newly loaded materials has been verified;
determining whether a tray supporting the newly loaded materials has been switched from use in producing a first product to use in producing a second product, upon a condition that the information of the newly loaded materials has not been verified;
presenting the information of the newly loaded materials to a user for material verification, upon a condition that the tray supporting the newly loaded materials is not switched from use in producing the first product to use in producing the second product;
determining whether the first product and the second product need a same material in the tray, upon a condition that the tray supporting the newly loaded materials has been switched from use in producing the first product to use in producing the second product;
determining whether a material verification has been performed on the tray within a first preset time before obtaining the information of the newly loaded materials, upon a condition that the first product and the second product need a same material in the tray;

presenting the information of the newly loaded materials to the user for material verification, upon a condition that no material verification has been performed on the tray within the first preset time before obtaining the information of the newly loaded materials;

determining whether the information presented to the user is verified within a second preset time;

issuing a first alarm message, upon a condition that the information presented to the user is not verified within the second preset time; and controlling a machine that is to use the newly loaded materials to produce products to stop working after the first alarm message is issued.

16. The non-transitory storage medium of claim 15, wherein the information of the newly loaded materials comprises a mark, if the information has been verified, the check mark is set as "1", and if the information has not been verified, the check mark is set as "0".

17. The non-transitory storage medium of claim 15, wherein the method further comprises:

determining whether there are materials the same as the newly loaded materials on the production line for producing a same batch of products, upon a condition that the first product and the second product need different materials in the tray; and presenting the information of the newly loaded materials to the user for material verification, upon a condition that there are no materials the same as the newly loaded materials on the production line for producing the same batch of products.

18. The non-transitory storage medium of claim 15, wherein the method further comprises:

presenting the information to the user through an application program installed on a terminal, wherein the application program displays the information according to a machine area of the newly loaded material, wherein the application program displays the information in a first page or section if the machine area corresponds to an odd-numbered area, and displays the information in a second page or section if the machine area corresponds to an even-numbered area.

19. The non-transitory storage medium of claim 15, wherein the method further comprises:

uploading the information to an application database, upon a condition that the information has been verified.

20. The non-transitory storage medium of claim 15, wherein the method further comprises:

obtaining abnormal information relating abnormal materials in the production line; and presenting the abnormal information to the user.

\* \* \* \* \*